(12) United States Patent
Kim et al.

(10) Patent No.: US 11,515,260 B2
(45) Date of Patent: Nov. 29, 2022

(54) METHOD FOR FABRICATING A SEMICONDUCTOR PACKAGE

(71) Applicant: SAMSUNG ELECTRONICS CO., LTD., Suwon-si (KR)

(72) Inventors: Da Hye Kim, Gwangmyeong-si (KR); Dong Kyu Kim, Anyang-si (KR); Jung-Ho Park, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 103 days.

(21) Appl. No.: 16/874,284

(22) Filed: May 14, 2020

(65) Prior Publication Data
US 2021/0050298 A1 Feb. 18, 2021

(30) Foreign Application Priority Data
Aug. 14, 2019 (KR) .................. 10-2019-0099323

(51) Int. Cl.
*H01L 23/538* (2006.01)
*H01L 23/00* (2006.01)
(Continued)

(52) U.S. Cl.
CPC ...... *H01L 23/5389* (2013.01); *H01L 21/4853* (2013.01); *H01L 21/4857* (2013.01);
(Continued)

(58) Field of Classification Search
CPC ............ H01L 23/5389; H01L 21/4853; H01L 21/4857; H01L 21/565; H01L 21/568; H01L 21/6835; H01L 23/3128; H01L 23/5383; H01L 23/5386; H01L 24/19; H01L 24/20; H01L 25/162; H01L 25/50; H01L 2221/68372; H01L 2224/214; H01L 2225/1035; H01L 2225/1058; H01L 2224/73253; H01L 2224/97; H01L 23/49816; H01L 23/49822; H01L 24/13;
(Continued)

(56) References Cited

U.S. PATENT DOCUMENTS
7,268,012 B2 9/2007 Jiang et al.
9,460,951 B2 10/2016 Lin
(Continued)

FOREIGN PATENT DOCUMENTS
JP 2007-242888 9/2007
KR 10-2017-0090772 8/2017

*Primary Examiner* — Kyoung Lee
*Assistant Examiner* — Christina A Sylvia
(74) *Attorney, Agent, or Firm* — F. Chau & Associates, LLC

(57) ABSTRACT

A method for fabricating a semiconductor package includes forming a release layer on a first carrier substrate. An etch stop layer is formed on the release layer. A first redistribution layer is formed on the etch stop layer and includes a plurality of first wires and a first insulation layer surrounding the plurality of first wires. A first semiconductor chip is formed on the first redistribution layer. A solder ball is formed between the first redistribution layer and the first semiconductor chip. A second carrier substrate is formed on the first semiconductor chip. The first carrier substrate, the release layer, and the etch stop layer are removed. The second carrier substrate is removed.

20 Claims, 15 Drawing Sheets

(51) Int. Cl.
  *H01L 25/16* (2006.01)
  *H01L 25/00* (2006.01)
  *H01L 21/683* (2006.01)
  *H01L 21/48* (2006.01)
  *H01L 21/56* (2006.01)
  *H01L 23/31* (2006.01)

(52) U.S. Cl.
  CPC .......... *H01L 21/565* (2013.01); *H01L 21/568* (2013.01); *H01L 21/6835* (2013.01); *H01L 23/3128* (2013.01); *H01L 23/5383* (2013.01); *H01L 23/5386* (2013.01); *H01L 24/19* (2013.01); *H01L 24/20* (2013.01); *H01L 25/162* (2013.01); *H01L 25/50* (2013.01); *H01L 2221/68372* (2013.01); *H01L 2224/214* (2013.01); *H01L 2225/1035* (2013.01); *H01L 2225/1058* (2013.01)

(58) Field of Classification Search
  CPC ......... H01L 24/16; H01L 24/48; H01L 24/73; H01L 24/81; H01L 24/83; H01L 24/92; H01L 24/97; H01L 2221/68345; H01L 2221/68381; H01L 2224/13109; H01L 2224/13111; H01L 2224/13113; H01L 2224/13116; H01L 2224/13118; H01L 2224/1312; H01L 2224/13139; H01L 2224/13144; H01L 2224/13147; H01L 2224/16227; H01L 2224/16235; H01L 2224/32225; H01L 2224/48227; H01L 2224/73204; H01L 2224/81005; H01L 2224/83005; H01L 2224/85005; H01L 2224/92125; H01L 25/0657; H01L 25/105; H01L 2225/06572; H01L 2225/1041; H01L 2924/15192; H01L 2924/15311; H01L 2924/18161; H01L 21/561; H01L 23/49838; H01L 23/525; H01L 21/56; H01L 21/76829; H01L 21/76865; H01L 23/32; H01L 23/485; H01L 24/11
  See application file for complete search history.

(56) References Cited

U.S. PATENT DOCUMENTS

| | | | |
|---|---|---|---|
| 9,646,918 B2 | 5/2017 | Cheng et al. | |
| 9,899,248 B2 | 2/2018 | Yu et al. | |
| 2016/0049441 A1* | 2/2016 | Shieh | H01L 27/14612 257/43 |
| 2016/0056057 A1* | 2/2016 | Yu | H01L 21/78 257/774 |
| 2016/0248037 A1* | 8/2016 | Liu | H01L 51/524 |
| 2018/0033745 A1* | 2/2018 | Cheng | H01L 21/304 |
| 2019/0123021 A1 | 4/2019 | Pan et al. | |
| 2019/0148276 A1* | 5/2019 | Chen | H01L 21/486 257/774 |
| 2019/0182955 A1* | 6/2019 | Murtagian | H05K 1/141 |
| 2019/0341257 A1* | 11/2019 | Raley | H01L 21/31116 |

* cited by examiner

METHOD FOR FABRICATING A SEMICONDUCTOR PACKAGE

This application claims priority under 35 U.S.C. § 119 to Korean Patent Application No. 10-2019-0099323, filed on Aug. 14, 2019 in the Korean Intellectual Property Office (KIPO), the disclosure of which is incorporated by reference in its entirety herein.

1. TECHNICAL FIELD

The present disclosure relates to a method for fabricating a semiconductor package.

2. DISCUSSION OF RELATED ART

The sizes of semiconductor chips and semiconductor packages have increased in recent years as the consumer demand for high-performance electronic devices has increased. However, the thicknesses of semiconductor packages have decreased due to recent trends towards relatively thin electronic devices.

Semiconductor packages have been developed to provide improved performance to satisfy the demands for multi functionality, high-capacitance, and miniaturization. For example, a plurality of semiconductor chips may be integrated into a single semiconductor package, and thus, high-capacitance and multi functionality may be achieved while significantly reducing the size of the semiconductor package.

SUMMARY

An object to be achieved by the present inventive concepts is to provide a method for fabricating a semiconductor package, which forms an etch stop layer including metal between a carrier substrate and a redistribution layer, and prevents the redistribution layer from being damaged in a debonding process of the carrier substrate.

According to an exemplary embodiment of the present inventive concepts, a method for fabricating a semiconductor package includes forming a release layer on a first carrier substrate. An etch stop layer is formed on the release layer. A first redistribution layer is formed on the etch stop layer and includes a plurality of first wires and a first insulation layer surrounding the plurality of first wires. A first semiconductor chip is formed on the first redistribution layer. A solder ball is formed between the first redistribution layer and the first semiconductor chip. A second carrier substrate is formed on the first semiconductor chip. The first carrier substrate, the release layer, and the etch stop layer are removed. The second carrier substrate is removed.

According to an exemplary embodiment of the present inventive concepts, a method for fabricating a semiconductor package includes forming a release layer on a first carrier substrate. An etch stop layer comprising metal is formed on the release layer. A first redistribution layer is formed on the etch stop layer. The first redistribution layer includes a plurality of first wires and a first insulation layer surrounding the plurality of first wires. A first semiconductor chip is formed on the first redistribution layer. A solder ball is formed between the first redistribution layer and the first semiconductor chip. A molding layer is formed that covers the first semiconductor chip. The first carrier substrate, the release layer, and the etch stop layer are removed. The release layer and the first insulation layer comprise a same material.

According to an exemplary embodiment of the present inventive concepts, a method for fabricating a semiconductor package includes forming a release layer on a first carrier substrate. An etch stop layer comprising metal is formed on the release layer. A first redistribution layer is formed on the etch stop layer. The first redistribution layer includes a plurality of first wires and a first insulation layer surrounding the plurality of first wires. A first semiconductor chip is formed on the first redistribution layer. A solder ball is formed between the first redistribution layer and the first semiconductor chip. A molding layer is formed that covers the first semiconductor chip. A second carrier substrate is formed on the molding layer. The first carrier substrate, the release layer, and the etch stop layer are removed. The second carrier substrate is removed. The release layer and the first insulation layer comprise a same material.

The objectives that are intended to be addressed by the present inventive concepts are not limited to those mentioned above, and other objectives that are not mentioned above may be clearly understood to those skilled in the art based on the description provided below.

BRIEF DESCRIPTION OF THE DRAWINGS

The above and other objects, features and advantages of the present inventive concepts will become more apparent to those of ordinary skill in the art by describing in detail exemplary embodiments thereof with reference to the accompanying drawings, in which.

DETAILED DESCRIPTION OF EXEMPLARY EMBODIMENTS

According to some exemplary embodiments of the present inventive concepts, a method for fabricating a semiconductor package may include fabricating a fan-out package. For example, a semiconductor chip may be formed on a redistribution layer. The semiconductor chip may be electrically connected to an external device through the redistribution layer and a solder ball formed on the redistribution layer. However, exemplary embodiments of the present inventive concepts are not limited thereto. In the present Specification, the terms "formed on" and "disposed on" mean that an element is formed either directly on another element or the element is formed indirectly thereon with one or more intervening elements/layers present. The term "formed directly on" means that an element is formed directly on another element with no intervening elements/layers present.

Hereinafter, a semiconductor package fabricated by a method for fabricating a semiconductor package according to some exemplary embodiments of the present inventive concepts will be described with reference to FIG. 1.

Figure 1:
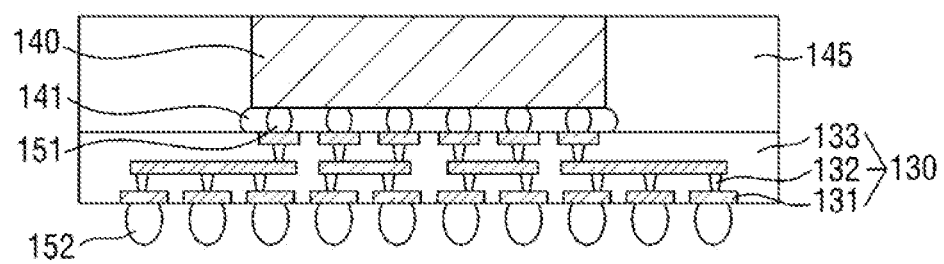
FIG. 1 is a cross-sectional view of a semiconductor package according to an exemplary embodiment of the present inventive concepts.
Figure 1:
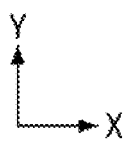

FIG. 1 is a cross-sectional view provided to explain a semiconductor package fabricated by a method for fabricating a semiconductor package according to an exemplary embodiment of the present inventive concepts.

The semiconductor package may include a first redistribution layer 130, a first semiconductor chip 140, a first underfill material 141, a first molding layer 145, a first solder ball 151, and a second solder ball 152.

The first redistribution layer 130 may include a plurality of first wires 131, a first redistribution via 132, and a first insulation layer 133.

As shown in the exemplary embodiment of FIG. 1, the plurality of first wires 131 may include a plurality of wires spaced apart from one another in a horizontal direction (e.g., the X direction). In addition, the plurality of first wires 131 may also include a plurality of wires spaced apart from one another in a vertical direction (e.g., the Y direction). For example, the plurality of first wires 131 may include a plurality of wires spaced apart from one another in the horizontal direction and formed on different levels. As shown in the exemplary embodiment of FIG. 1, the plurality of first wires 131 may include first wires 131 that are horizontally arranged and formed on three different levels. However, exemplary embodiments of the present inventive concepts are not limited thereto. A plurality of first redistribution vias 132 are formed on first wires 131 on each level and extend vertically (e.g., in the Y direction) to connect first wires 131 to each other on different levels.

Each of the wires included in the plurality of first wires 131 may include a conductive material. For example, each of the wires included in the plurality of first wires 131 may include copper (Cu). In an exemplary embodiment, each of the wires included in the plurality of first wires 131 may include at least one compound selected from carbon (C), silver (Ag), cobalt (Co), tantalum (Ta), indium (In), tin (Sn), zinc (Zn), manganese (Mn), titanium (Ti), magnesium (Mg), chromium (Cr), germanium (Ge), strontium (Sr), platinum (Pt), magnesium (Mg), aluminum (Al), and zirconium (Zr).

The first redistribution via 132 may electrically connect between the plurality of first wires 131 formed on different levels. The first redistribution via 132 may include a conductive material. For example, in an exemplary embodiment, the first redistribution via 132 may include a same material as the material of the plurality of first wires 131. However, exemplary embodiments of the present inventive concepts are not limited thereto.

The first insulation layer 133 may be arranged to surround the plurality of first wires 131 and the first redistribution via 132, respectively.

In an exemplary embodiment, the first insulation layer 133 may include a photo imageable dielectric (PID). For example, the first insulation layer 133 may include a photosensitive insulating material. In an exemplary embodiment, the first insulation layer 133 may include at least one compound selected from epoxy and polyimide. However, exemplary embodiments of the present inventive concepts are not limited thereto.

In an exemplary embodiment, the first semiconductor chip 140 may be a logic chip or a memory chip. In an embodiment in which the first semiconductor chip 140 is a logic chip, the first semiconductor chip 140 may be, for example, a central processing unit (CPU), a controller, an application specific integrated circuit (ASIC) or the like. However, exemplary embodiments of the present inventive concepts are not limited thereto.

In embodiments in which the first semiconductor chip 140 is a memory chip, the first semiconductor chip 140 may be, for example, a volatile memory chip such as a dynamic random access memory (DRAM) or a static RAM (SRAM), or a nonvolatile memory chip such as a phase-change RAM (PRAM), a magneto resistive RAM (MRAM), a ferroelectric RAM (FeRAM), or a resistive RAM (RRAM). However, exemplary embodiments of the present inventive concepts are not limited thereto.

The first solder ball 151 may be arranged between the first redistribution layer 130 and the first semiconductor chip 140. For example, as shown in the exemplary embodiment of FIG. 1, the first solder ball 151 may be a plurality of discrete solder bumps that are spaced apart (e.g., in the X direction). The first solder ball 151 may be in contact with the plurality of first wires 131 exposed on an upper surface of the first redistribution layer 130. For example, as shown in the exemplary embodiment of FIG. 1, a bottom surface of the first solder ball 151 may directly contact a top surface of a first wire 131 located on the highest level of the plurality of first wires. A top surface of the first solder ball 151 may contact the first semiconductor chip 140. For example, in an exemplary embodiment, a top surface of the first solder ball 151 may be in direct contact with a conductive terminal exposed on a lower surface of the first semiconductor chip 140.

The first semiconductor chip 140 may be electrically connected with the first redistribution layer 130 through the first solder ball 151. However, exemplary embodiments of the present inventive concepts are not limited thereto. For example, in other exemplary embodiments, the first semiconductor chip 140 may be electrically connected with the first redistribution layer 130 through wire bonding.

In an exemplary embodiment, the first solder ball 151 may include at least one compound selected from tin (Sn), indium (In), lead (Pb), zinc (Zn), nickel (Ni), gold (Au), silver (Ag), copper (Cu), antimony (Sb), bismuth (Bi), and a combination thereof. However, exemplary embodiments of the present inventive concepts are not limited thereto.

The first underfill material 141 may be arranged between the first redistribution layer 130 and the first semiconductor chip 140 (e.g., in the Y direction). The first underfill material 141 may be arranged to surround a side surface of the first solder ball 151 (e.g., the outermost lateral side surfaces of the first solder ball 151 in the X direction).

The first underfill material 141 may be formed to further protrude from a side surface of the first semiconductor chip 140 in a lateral direction. For example, in an exemplary embodiment, at least one of the outermost lateral surfaces of the first underfill material extends farther than the first semiconductor chip 140 (e.g., in the X direction) and does not overlap with the first semiconductor chip (e.g., in the Y direction). However, exemplary embodiments of the present inventive concepts are not limited thereto.

The first molding layer 145 may be arranged on the first redistribution layer 130. For example, in an exemplary embodiment, the first molding layer 145 may be arranged to surround the upper surface of the first redistribution layer 130 facing the first semiconductor chip 140, side surfaces of the first underfill material 141, and side surfaces of the first semiconductor chip 140.

Although the exemplary embodiment of FIG. 1 illustrates an upper surface of the first molding layer 145 and an upper surface of the first semiconductor chip 140 as being coplanar with each other (e.g., in the Y direction), exemplary embodiments of the present inventive concepts are not limited thereto. For example, in another exemplary embodiment, the upper surface of the first molding layer 145 may be arranged to cover the upper surface of the first semiconductor chip 140 (e.g., in the Y direction).

In an exemplary embodiment, the first molding layer 145 may include an epoxy molding compound (EMC) or two types or more of silicone hybrid materials.

The second solder ball 152 may be arranged on a lower surface of the first redistribution layer 130. As shown in the exemplary embodiment of FIG. 1, the second solder ball 152 may be a plurality of discrete solder bumps that are spaced apart (e.g., in the X direction). In an exemplary embodiment, the discrete solder bumps of the second solder ball 152 may be larger than the solder bumps of the first solder ball 151. However, exemplary embodiments of the present inventive concepts are not limited thereto. As shown in the exemplary embodiment of FIG. 1, a top surface of the second solder ball 152 may directly contact a bottom surface of the first redistribution layer 130. The second solder ball 152 may be in contact with the plurality of first wires 131 exposed on the lower surface of the first redistribution layer 130. The second solder ball 152 may convexly protrude from the lower surface of the first redistribution layer 130. The second solder ball 152 may electrically connect the first redistribution layer 130 to an external device. For example, an external device may be electrically connected to a portion of the second solder ball 152 (e.g., bottom or side surfaces) to electrically connect the external device with the first redistribution layer 130.

In an exemplary embodiment, the second solder ball 152 may include, for example, at least one compound selected from tin (Sn), indium (In), lead (Pb), zinc (Zn), nickel (Ni), gold (Au), silver (Ag), copper (Cu), antimony (Sb), bismuth (Bi), and a combination thereof. However, exemplary embodiments of the present inventive concepts are not limited thereto.

Hereinbelow, a method for fabricating a semiconductor package according to some exemplary embodiments will be described with reference to FIGS. 1 to 8.

FIGS. 2 to 8 are cross-sectional views illustrating intermediate stages of fabrication, provided to explain a method for fabricating a semiconductor package according to some exemplary embodiments of the present inventive concepts.

Figure 2:
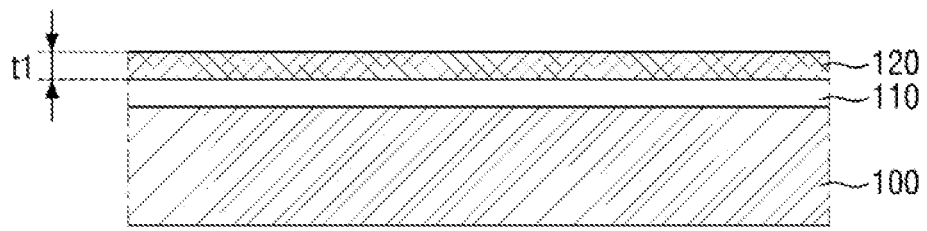
FIGS. 2 to 8 are cross-sectional views illustrating a method for fabricating a semiconductor package according to exemplary embodiments of the present inventive concepts.
Figure 2:
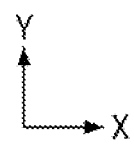

Referring to FIG. 2, a release layer 110 may be formed on a first carrier substrate 100.

In an exemplary embodiment, the first carrier substrate 100 may include at least one material selected from silicon, metal, glass, plastic, ceramic, or the like. However, exemplary embodiments of the present inventive concepts are not limited thereto.

The release layer 110 may be in contact with the first carrier substrate 100. For example, in an exemplary embodiment, a bottom surface of the release layer 110 may directly contact a top surface of the first carrier substrate 100. The release layer 110 may be conformally formed on the first carrier substrate 100. However, exemplary embodiments of the present inventive concepts are not limited thereto.

In an exemplary embodiment, the release layer 110 may include a same material as the material of the first insulation layer 133 shown in FIG. 1. For example, the release layer 110 may include a photosensitive insulating material, such as at least one compound selected from epoxy and polyimide. However, exemplary embodiments of the present inventive concepts are not limited thereto. For example, in another exemplary embodiment, the release layer 110 may be an inorganic release layer for introducing stable detachable characteristics. In this embodiment, the release layer 110 may be, for example, a carbon material. However, exemplary embodiments of the present inventive concepts are not limited thereto. The release layer may have a first etch selectivity.

Thereafter, an etch stop layer 120 may be formed on the release layer 110. The etch stop layer 120 may be in contact with the release layer 110. For example, a bottom surface of the etch stop layer 120 may directly contact a top surface of the release layer 110. The etch stop layer 120 may be conformally formed on the release layer 110. However, exemplary embodiments of the present inventive concepts are not limited thereto.

The etch stop layer 120 may have a second etch selectivity. The second etch selectivity of the etch stop layer 120 may be smaller than the first etch selectivity of the release layer 110. Accordingly, the first carrier substrate 100 and the release layer 110 may be selectively removed in a subsequent process.

In an exemplary embodiment, the etch stop layer 120 may include metal. For example, the etch stop layer 120 may include titanium (Ti). However, exemplary embodiments of the present inventive concepts are not limited thereto. For example, in another exemplary embodiment, the etch stop layer 120 may include other metal having a smaller etch selectivity than the etch selectivity of the release layer 110.

In an exemplary embodiment, a thickness t1 of the etch stop layer 120 in the Y direction may be, for example, about 100 nm to about 500 nm. For example, the thickness t1 of the etch stop layer 120 may be approximately about 225 nm to about 375 nm. However, exemplary embodiments of the present inventive concepts are not limited thereto.

Figure 3:
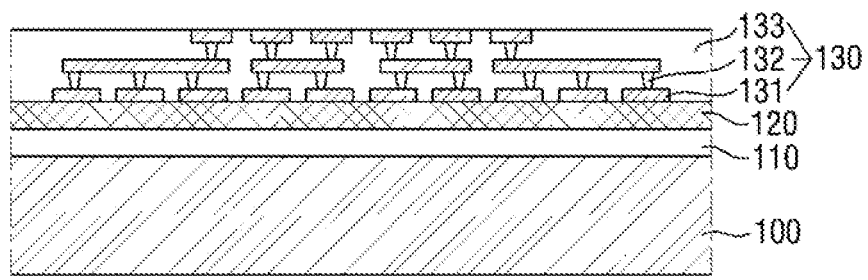

Referring to FIG. 3, the first redistribution layer 130 may be formed on the etch stop layer 120. For example, a bottom surface of the first redistribution layer 130 may directly contact a top surface of the etch stop layer 120.

The first redistribution layer 130 may include the plurality of first wires 131, the first redistribution via 132 connecting each of the plurality of first wires 131, and the first insulation layer 133 surrounding the plurality of first wires 131 and the first redistribution via 132.

Figure 4:
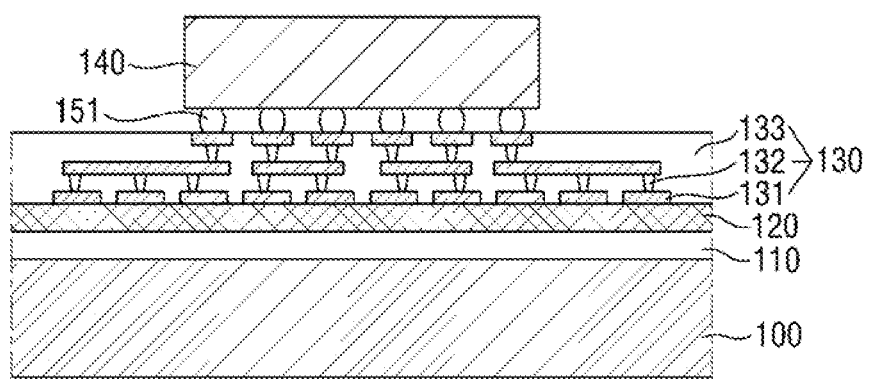

Referring to FIG. 4, the first semiconductor chip 140 may be formed on the first redistribution layer 130. In an exemplary embodiment, the first semiconductor chip 140 may be, for example, a logic chip or a memory chip. The first semiconductor chip 140 may be electrically connected with the first redistribution layer 130 through the first solder ball 151.

In the exemplary embodiment of FIG. 4, the first semiconductor chip 140 is electrically connected with the first redistribution layer 130 through the first solder ball 151. However, exemplary embodiments of the present inventive concepts are not limited thereto. For example, in another exemplary embodiment, the first semiconductor chip 140 may be electrically connected with the first redistribution layer 130 through wire bonding.

Figure 5:
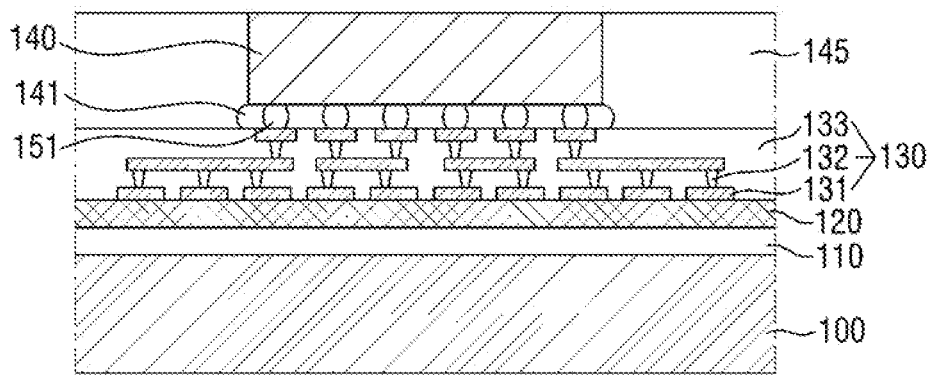

Referring to FIG. 5, the first underfill material 141 may be formed to surround the side surface of the first solder ball 151 between the first redistribution layer 130 and the first semiconductor chip 140 (e.g., the outermost lateral side surfaces of the first solder ball 151 in the X direction).

The first molding layer 145 may then be formed to cover the first semiconductor chip 140. For example, in an exemplary embodiment, the first molding layer 145 may be arranged to surround the side surfaces (e.g., in the X direction) and the upper surface (e.g., in the Y direction) of the first semiconductor chip 140, the side surfaces (e.g., in the X direction) of the first underfill material 141, and the upper surface (e.g., in the Y direction) of the first redistribution layer 130.

The upper surface of the first semiconductor chip 140 may be exposed by etching a portion of the first molding layer 145 through a planarization process. In an exemplary embodiment, the upper surface of the first molding layer 145 may be coplanar (e.g., in the Y direction) with the upper surface of the first semiconductor chip 140 after the planarization process. However, exemplary embodiments of the present inventive concepts are not limited thereto. For example, in another exemplary embodiment, the top surface of the first molding layer 145 may be formed at a higher level (e.g., in the Y direction) than the top surface of the first semiconductor chip 140 through the planarization process. Therefore, the top surface of the first molding layer 145 may cover the upper surface of the first semiconductor chip 140 after the planarization process.

Figure 6:
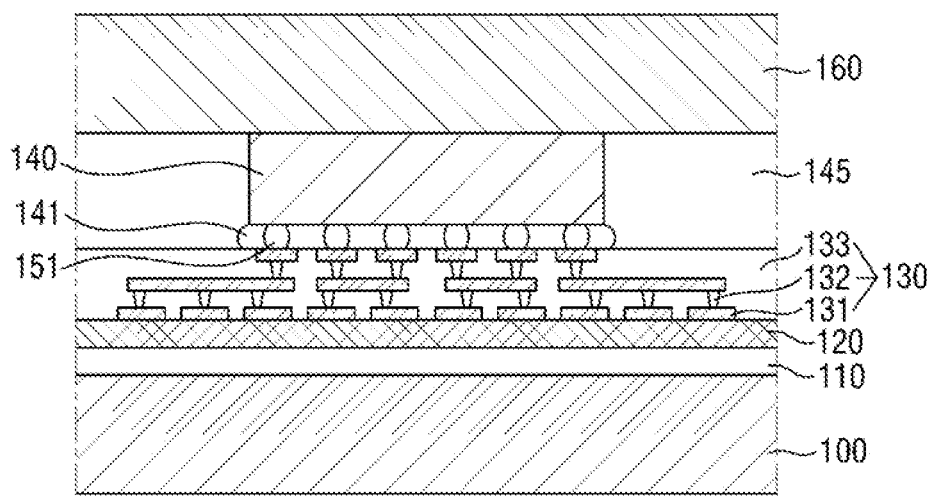

Referring to FIG. 6, a second carrier substrate 160 may be formed on the first semiconductor chip 140 and the first molding layer 145. For example, as shown in the exemplary embodiment of FIG. 6, a bottom surface of the second carrier substrate 160 may directly contact a top surface of the semiconductor chip 140 and the first molding layer 145. In an exemplary embodiment, the second carrier substrate 160 may include at least one material selected from silicon, metal, glass, plastic, ceramic, or the like. However, exemplary embodiments of the present inventive concepts are not limited thereto.

Figure 7:
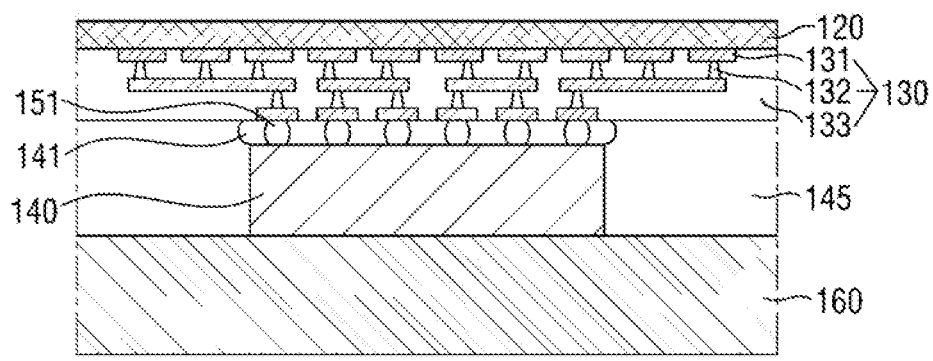
Figure 7:
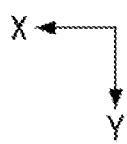

Referring to FIG. 7, after the second carrier substrate 160 is formed the device is turned upside down.

The first carrier substrate 100 and the release layer 110 may then be removed. For example, in an exemplary embodiment, the first carrier substrate 100 and the release layer 110 may be removed through a laser debonding process. However, exemplary embodiments of the present inventive concepts are not limited thereto.

In the process of removing the first carrier substrate 100 and the release layer 110, damage to the first redistribution layer 130 may be prevented due to the etch stop layer 120 having a smaller etch selectivity than the etch selectivity of the release layer 110.

Figure 8:
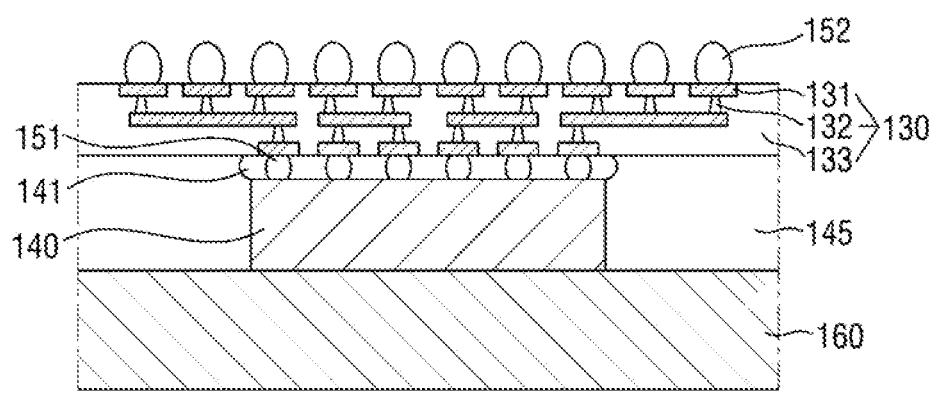
Figure 8:
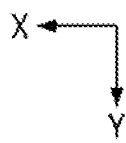

Referring to FIG. 8, the etch stop layer 120 may then be removed to expose the first redistribution layer 130. After the etch stop layer 120 is removed, the second solder ball 152 may be formed on the exposed first redistribution layer 130.

Referring to FIG. 1, after the second solder ball 152 is formed, the device may be turned upside down so that the second carrier substrate 160 is disposed on the top (e.g., in the Y direction). The second carrier substrate 160 may then be removed.

The semiconductor package shown in FIG. 1 may then be fabricated through a sawing process.

In an exemplary embodiment, the method for fabricating the semiconductor package includes forming the etch stop layer 120 including metal between the first carrier substrate 100 and the redistribution layer 130, such that the redistribution layer 130 is prevented from being damaged in the debonding process of the first carrier substrate 100.

Hereinbelow, a method for fabricating a semiconductor package according to some other exemplary embodiments will be described with reference to FIGS. 9 and 10. The difference from the method for fabricating the semiconductor package illustrated in FIGS. 1 to 8 will be highlighted.

Figure 9:
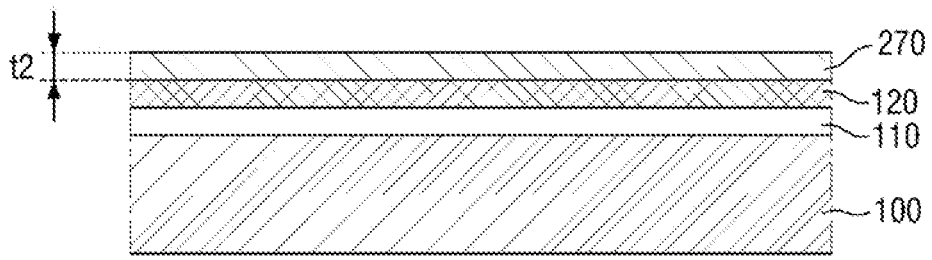
FIGS. 9 and 10 are cross-sectional views illustrating a method for fabricating a semiconductor package according to other exemplary embodiments of the present inventive concepts.
Figure 10:
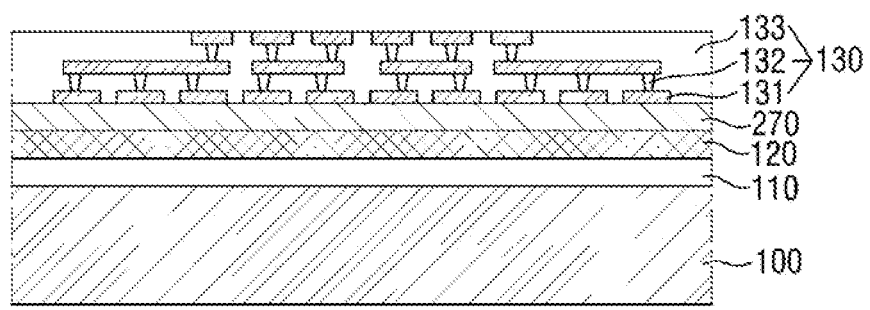

FIGS. 9 and 10 are cross-sectional views illustrating intermediate stages of fabrication, provided to explain a method for fabricating a semiconductor package according to alternative exemplary embodiments of the present inventive concepts.

Referring to FIG. 9, in the method for fabricating the semiconductor package according to some other exemplary embodiments, the release layer 110, the etch stop layer 120, and a metal layer 270 may be formed on the first carrier substrate 100 in sequence.

The metal layer 270 may be in contact with the etch stop layer 120. For example, as shown in the exemplary embodiment of FIG. 9, a bottom surface of the metal layer 270 may directly contact a top surface of the etch stop layer 120. The metal layer 270 may be conformally formed on the etch stop layer 120. However, exemplary embodiments of the present inventive concepts are not limited thereto.

The metal layer 270 may include a material that is different from the material of the etch stop layer 120. For example, the metal layer 270 may include a same material as the material of the plurality of first wires 131 shown in FIG. 10. In an exemplary embodiment, the metal layer 270 may include at least one compound selected from carbon (C), silver (Ag), cobalt (Co), tantalum (Ta), indium (In), tin (Sn), zinc (Zn), manganese (Mn), titanium (Ti), magnesium (Mg), chromium (Cr), germanium (Ge), strontium (Sr), platinum (Pt), magnesium (Mg), aluminum (Al), and zirconium (Zr).

A thickness t2 of the metal layer 270 in the second direction Y may be, for example, about 50 nm to about 350 run. However, exemplary embodiments of the present inventive concepts are not limited thereto.

Referring to FIG. 10, the first redistribution layer 130 may be formed on the metal layer 270. For example, as shown in the exemplary embodiment of FIG. 10, a bottom surface of the first redistribution layer 130 may directly contact a top surface of the metal layer 270.

The first redistribution layer 130 may include the plurality of first wires 131, the first redistribution via 132 connecting each of the plurality of first wires 131, and the first insulation layer 133 surrounding the plurality of first wires 131 and the first redistribution via 132.

In an exemplary embodiment, a wire of the plurality of first wires 131 that is in contact with the metal layer 270 may be formed by using the metal layer 270 as a seed layer.

The semiconductor package illustrated in FIG. 1 may be fabricated after the processes illustrated in FIGS. 4 to 8 are performed.

Hereinbelow, a method for fabricating a semiconductor package according to some other exemplary embodiments will be described with reference to FIGS. 11 to 14. The difference from the method for fabricating the semiconductor package illustrated in FIGS. 1 to 8 will be highlighted.

FIGS. 11 to 14 are cross-sectional views illustrating intermediate stages of fabrication, provided to explain a method for fabricating a semiconductor package according to exemplary embodiments of the present inventive concepts.

Figure 11:
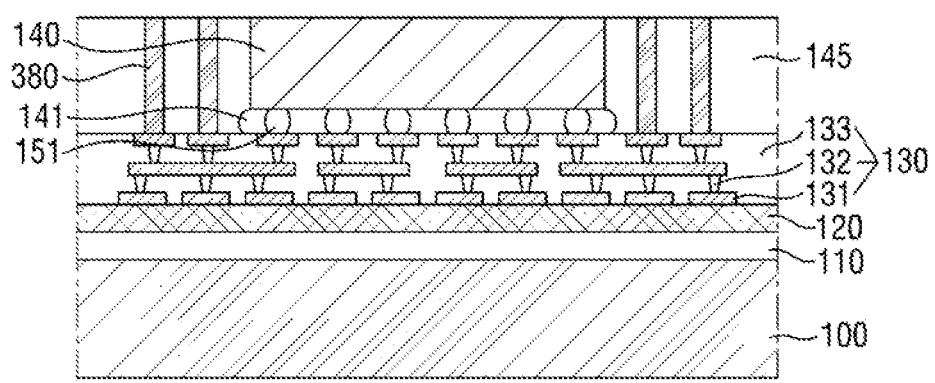
FIGS. 11 to 14 are cross-sectional views illustrating a method for fabricating a semiconductor package according to exemplary embodiments of the present inventive concepts.
Figure 11:
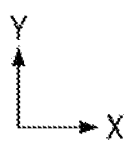

Referring to FIG. 11, in the method for fabricating the semiconductor package according to some exemplary embodiments, a via 380 penetrating through the first molding layer 145 in the second direction Y may be formed after the processes illustrated in FIGS. 2 to 5 are performed. For example, as shown in the exemplary embodiment of FIG. 11, the via 380 may include a plurality of discrete vias that extend in the Y direction and are arranged in the X direction. The via 380 may extend from a top portion of the redistribution layer 130 (e.g., a top surface of the first wires 131) to a top surface of the first molding layer 145. As shown in the exemplary embodiment of FIG. 11, the via 380 may be formed adjacent to lateral sides of the first semiconductor chip 140 (e.g., in the X direction) and are spaced apart from the first semiconductor chip 140 and the first underfill material 141 in a direction parallel to an upper surface of the first carrier substrate 100, such as the X direction.

The via 380 may be electrically connected with the plurality of first wires 131 exposed on the upper surface of the first redistribution layer 130.

The via 380 may include a conductive material. In an exemplary embodiment, the via 380 may include, for example, copper (Cu). In another exemplary embodiment, the via 380 may include at least one compound selected from carbon (C), silver (Ag), cobalt (Co), tantalum (Ta), indium (In), tin (Sn), zinc (Zn), manganese (Mn), titanium (Ti), magnesium (Mg), chromium (Cr), germanium (Ge), strontium (Sr), platinum (Pt), magnesium (Mg), aluminum (Al), and zirconium (Zr).

Figure 12:
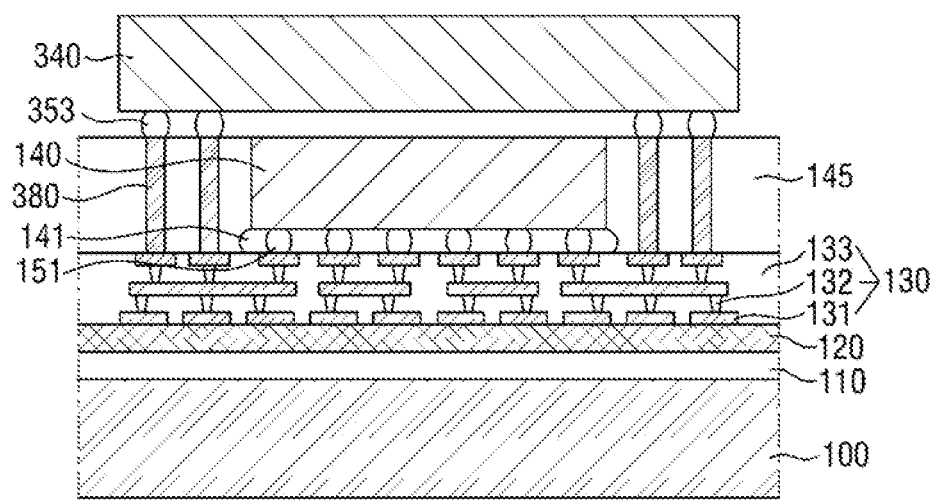
Figure 12:
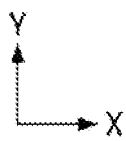

Referring to FIG. 12, a second semiconductor chip 340 may be formed on the first semiconductor chip 140. In an exemplary embodiment, the second semiconductor chip 340 may be a memory chip. For example, the second semiconductor chip 340 may be a volatile memory chip such as a dynamic random access memory (DRAM) or a static RAM (SRAM), or a nonvolatile memory chip such as a phase-change RAM (PRAM), a magneto resistive RAM (MRAM), a ferroelectric RAM (FeRAM), or a resistive RAM (RRAM). However, exemplary embodiments of the present inventive concepts are not limited thereto.

A third solder ball 353 may be disposed between the via 380 and the second semiconductor chip 340 (e.g., in the Y direction). As shown in the exemplary embodiment of FIG. 12, the third solder ball 353 may be a plurality of discrete solder bumps that are spaced apart (e.g., in the X direction). The third solder ball 353 may be in contact with the via 380 exposed on the first molding layer 145. For example, as shown in the exemplary embodiment of FIG. 12, a bottom surface of the third solder ball 353 may directly contact a top surface of the via and a top surface of the third solder ball 353 may directly contact a bottom surface of the second semiconductor chip. In an exemplary embodiment, the third solder ball 353 may directly contact a conductive terminal exposed on a lower surface of the second semiconductor chip 340.

The second semiconductor chip 340 may be electrically connected with the first redistribution layer 130 through the third solder ball 353 and the via 380.

Figure 13:
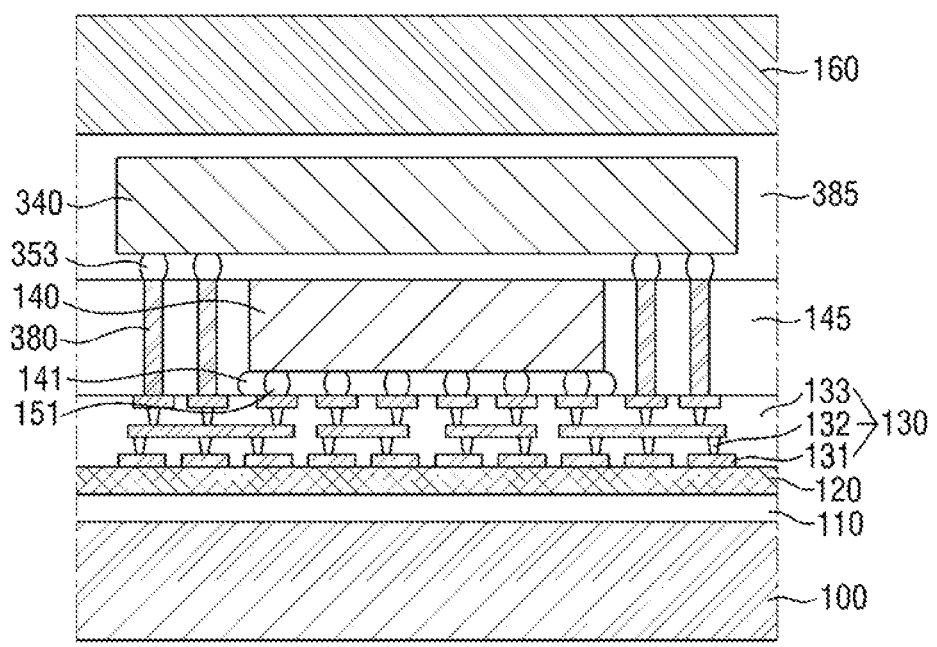

Referring to FIG. 13, a second molding layer 385 may be formed on the first molding layer to cover the second semiconductor chip 340.

The second molding layer 385 may be formed to surround the upper surface of the first molding layer 145, the upper surface of the first semiconductor chip 140, the third solder ball 353, and the upper, side and bottom surfaces of the second semiconductor chip 340.

The second molding layer 385 may include, for example, epoxy molding compound (EMC) or two types or more of silicone hybrid materials.

The second carrier substrate 160 may then be formed on the second molding layer 385.

Figure 14:
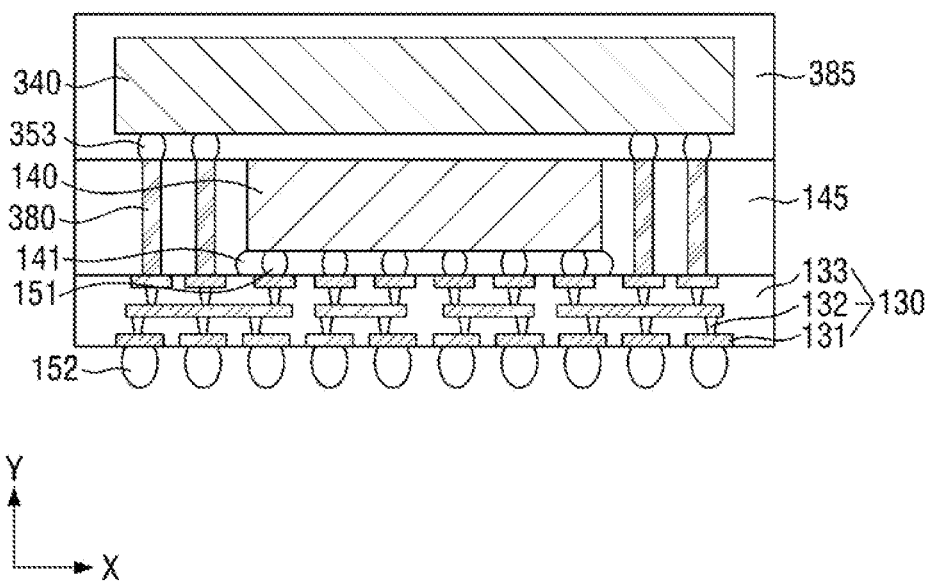

Referring to FIG. 14, a semiconductor package illustrated in FIG. 14 may be fabricated after the processes illustrated in FIGS. 7 and 8 are performed in sequence.

For example, after the second carrier substrate 160 is formed, the device may be turned upside down. The first carrier substrate 100, the release layer 110, and the etch stop layer 120 may then be removed and the second solder ban 152 may then be formed on the first redistribution layer 130.

The device may then be turned upside down and the second carrier substrate 160 may then be removed. The semiconductor package illustrated in FIG. 14 may then be fabricated through a sawing process.

Hereinbelow, a method for fabricating a semiconductor package according to some other exemplary embodiments of the present inventive concepts will be described with reference to FIGS. 15 to 18. The difference from the method for fabricating the semiconductor package illustrated in FIGS. 1 to 8 will be highlighted.

FIGS. 15 to 18 are cross-sectional views illustrating intermediate stages of fabrication, provided to explain a method for fabricating a semiconductor package according to some other exemplary embodiments.

Figure 15:
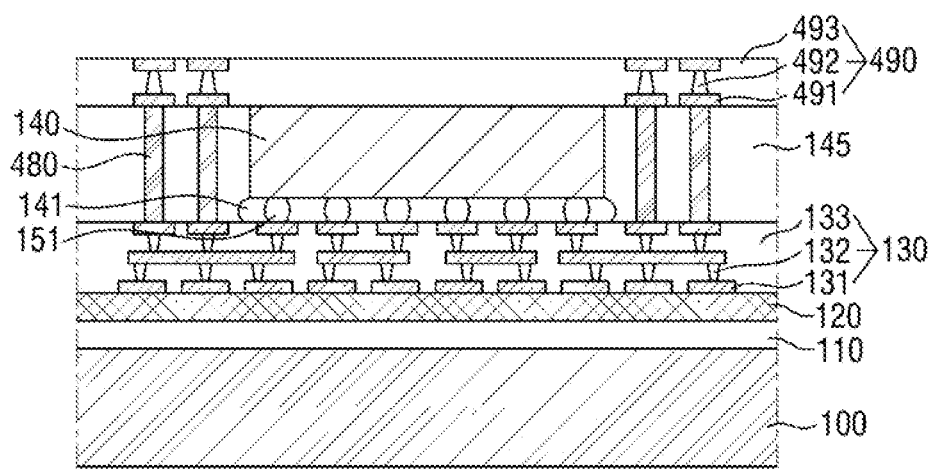
FIGS. 15 to 18 are cross-sectional views illustrating a method for fabricating a semiconductor package according to some other exemplary embodiments of the present inventive concepts.
Figure 15:
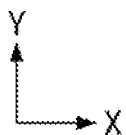

Referring to FIG. 15, in the method for fabricating the semiconductor package according to some other exemplary embodiments, a via 480 penetrating through the first molding layer 145 in the second direction Y may be formed after the processes illustrated in FIGS. 2 to 5 are performed. As shown in the exemplary embodiment of FIG. 15, the via 480 may be formed on lateral sides of the first semiconductor chip 140 (e.g., in the X direction) and are spaced apart from the first semiconductor chip 140 and the first underfill material 141 in the X direction.

A second redistribution layer 490 may then be formed on the first semiconductor chip 140, the first molding layer 145, and the via 480.

The second redistribution layer 490 may include a plurality of second wires 491, a second redistribution via 492 connecting each of the plurality of second wires 491, and a second insulation layer 493 surrounding the plurality of second wires 491 and the second redistribution via 492. While the second wires 491 shown in the exemplary embodiment of FIG. 15 include horizontally arranged second wires 491 that are formed on two levels (e.g., in the Y direction), exemplary embodiments of the present inventive concepts are not limited thereto. For example, in other exemplary embodiments, the second wires 491 may be formed on three or more levels. The plurality of second wires 491 exposed on a lower surface of the second redistribution layer 490 may be electrically connected with the via 480. For example, a bottom surface of the second wires 491 may contact a top surface of the via 480.

Figure 16:
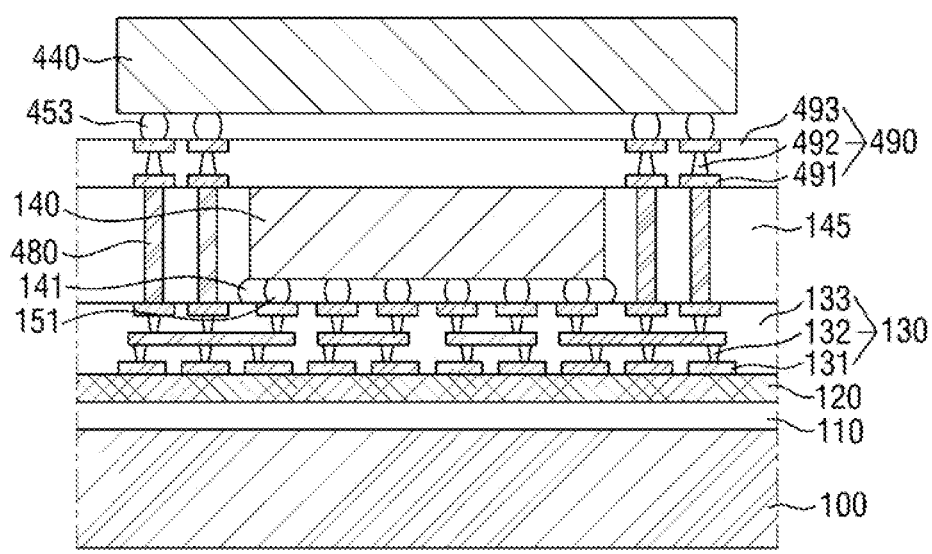

Referring to FIG. 16, a second semiconductor chip 440 may be formed on the second redistribution layer 490. In an exemplary embodiment, the second semiconductor chip 440 may be a memory chip.

A third solder ball 453 may be formed between the second redistribution layer 490 and the second semiconductor chip 440 (e.g., in the Y direction). For example, a bottom surface of the third solder ball 453 may contact a top surface of second redistribution layer 490 and a top surface of the third solder ball 453 may contact a bottom surface of the second semiconductor chip 440. In an exemplary embodiment, the third solder ball 453 may be in contact with a conductive terminal exposed on the second redistribution layer 490. The third solder ball 453 may also be in contact with a conductive terminal exposed on a lower surface of the second semiconductor chip 440.

The second semiconductor chip 440 may be electrically connected with the first redistribution layer 130 through the third solder ball 453, the second redistribution layer 490, and the via 480.

Figure 17:
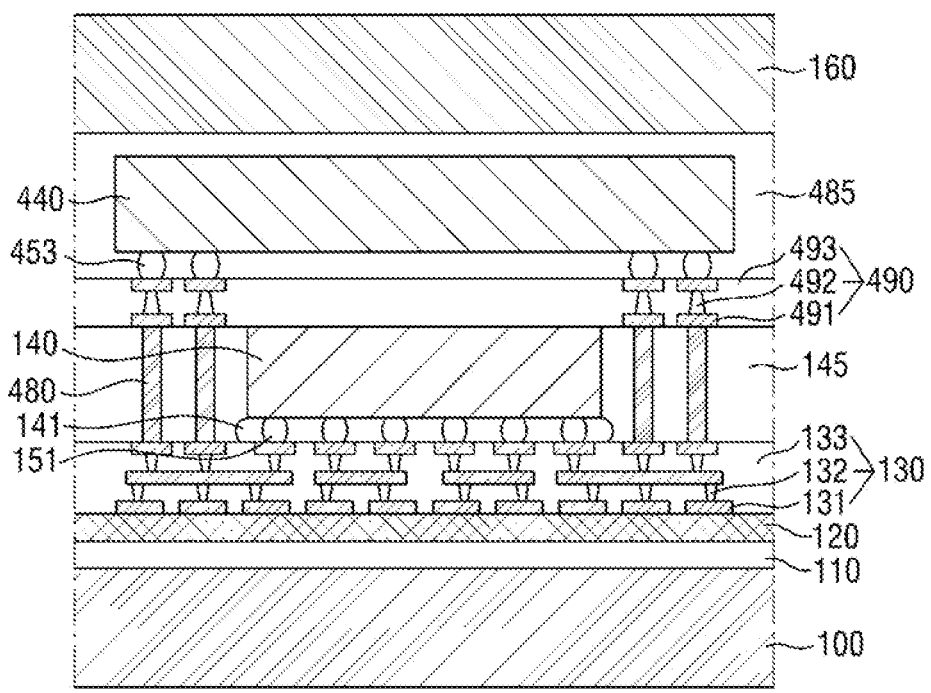

Referring to FIG. 17, a second molding layer 485 may be formed on the second redistribution layer 490 to cover the second semiconductor chip 440.

The second molding layer 485 may be formed to surround the upper surface of the second redistribution layer 490, the third solder ball 453, and the upper surface and side surfaces of the second semiconductor chip 440.

In an exemplary embodiment, the second molding layer 485 may include epoxy molding compound (EMC) or two types or more of silicone hybrid materials. However, exemplary embodiments of the present inventive concepts are not limited thereto.

The second carrier substrate 160 may then be formed on the second molding layer 485.

Figure 18:
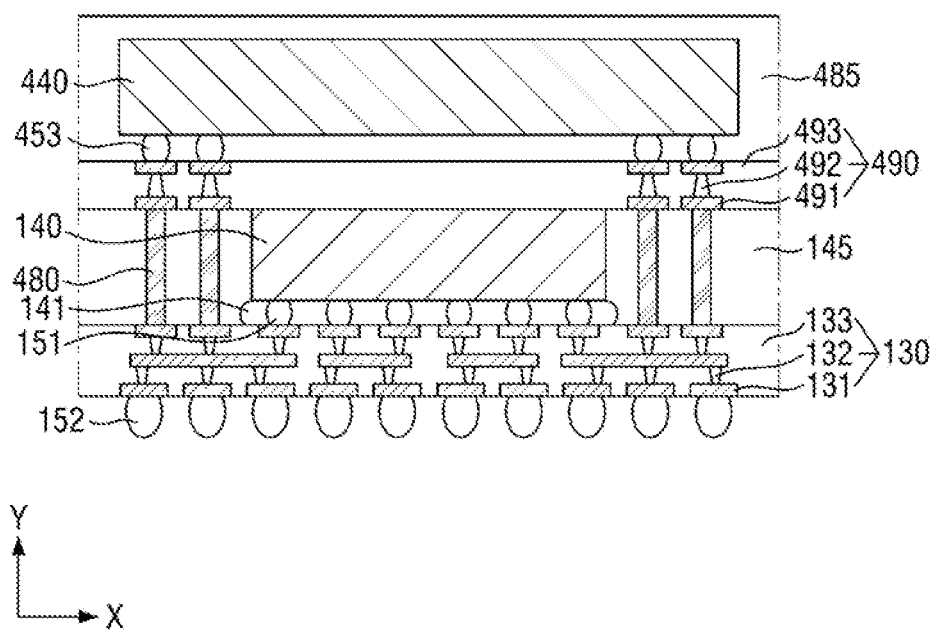

Referring to FIG. 18, a semiconductor package illustrated in FIG. 18 may be fabricated after the processes illustrated in FIGS. 7 and 8 are performed in sequence.

For example, after the second carrier substrate 160 is formed, the device is turned upside down.

The first carrier substrate 100, the release layer 110, and the etch stop layer 120 may then be removed and the second solder ball 152 may be formed on the first redistribution layer 130. The device may then be turned upside down and the second carrier substrate 160 may then be removed. The semiconductor package illustrated in FIG. 18 may then be fabricated through a sawing process.

Hereinafter, a method for fabricating a semiconductor package according to some other exemplary embodiments will be described with reference to FIG. 19. The difference from the method for fabricating the semiconductor package illustrated in FIGS. 1 to 8 will be highlighted.

Figure 19:
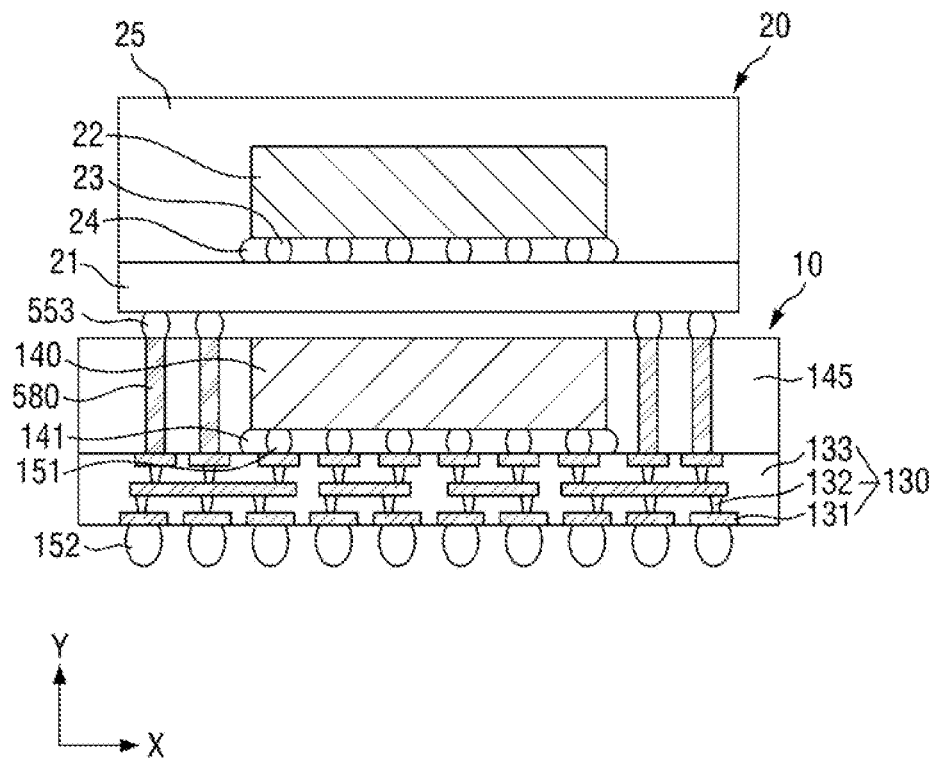
FIG. 19 is a cross-sectional view of a semiconductor package according to an exemplary embodiment of the present inventive concepts.

FIG. 19 is a cross-sectional view provided to explain a semiconductor package fabricated by a method for fabricating a semiconductor package according to some other exemplary embodiments of the present inventive concepts.

Referring to FIG. 19, in the method for fabricating the semiconductor package according to some other exemplary embodiments, a second package 20 may be formed on a first package 10 after the processes illustrated in FIGS. 2 to 5, FIG. 11, and FIGS. 6 to 8, and FIG. 1 are performed in sequence.

In an exemplary embodiment, the second package 20 may include a substrate 21, a second semiconductor chip 22, a fourth solder ball 23, a second underfill material 24, and a second molding layer 25.

In an exemplary embodiment, the substrate 21 may be a printed circuit board (PCB) or a ceramic substrate. Further, the substrate 21 may be an interposer. However, exemplary embodiments of the present inventive concepts are not limited thereto.

In an exemplary embodiment, the second semiconductor chip 22 may be a memory chip. The fourth solder ball 23 may be formed between the substrate 21 and the second semiconductor chip 22 (e.g., in the Y direction). For example, as shown in the exemplary embodiment of FIG. 19, the fourth solder ball 23 may be a plurality of discrete solder bumps that are spaced apart (e.g., in the X direction). As shown in the exemplary embodiment of FIG. 19, a bottom surface of the fourth solder ball 23 may contact a top surface of the substrate 21 and a top surface of the fourth solder ball 23 may contact a bottom surface of the second semiconductor chip 22. For example, in an exemplary embodiment, a bottom surface of the fourth solder ball 23 may be in contact with a conductive terminal exposed on the substrate 21. A top surface of the fourth solder ball 23 may be in contact with a conductive socket arranged on a lower surface of the second semiconductor chip 22.

The second underfill material 24 may be formed to surround a side surface of the fourth solder ball 23 between the substrate 21 and the second semiconductor chip 22 (e.g., the outermost lateral side surfaces of the fourth solder ball 23 in the X direction). The second molding layer 25 may be formed to surround an upper surface of the substrate 21 facing the second semiconductor chip 22, side surfaces of the second underfill material 24, and the upper surface and side surfaces of the second semiconductor chip 22.

A third solder ball 553 may be formed between a via 580 and the substrate 21 (e.g., in the Y direction). The third solder ball 553 (e.g., a bottom surface in the Y direction) may be in contact with the via 580 exposed on the first molding layer 145. In addition, the third solder ball 553 may be in contact with a lower surface of the substrate 21, such as a conductive terminal exposed on a lower surface of the substrate 21.

The second package 20 may be electrically connected with the first package 10 through the third solder ball 553 and the via 580.

Hereinbelow, a method for fabricating a semiconductor package according to some other exemplary embodiments of the present inventive concepts will be described with reference to FIG. 20. The difference from the method for fabricating the semiconductor package illustrated in FIGS. 1 to 8 will be highlighted.

Figure 20:
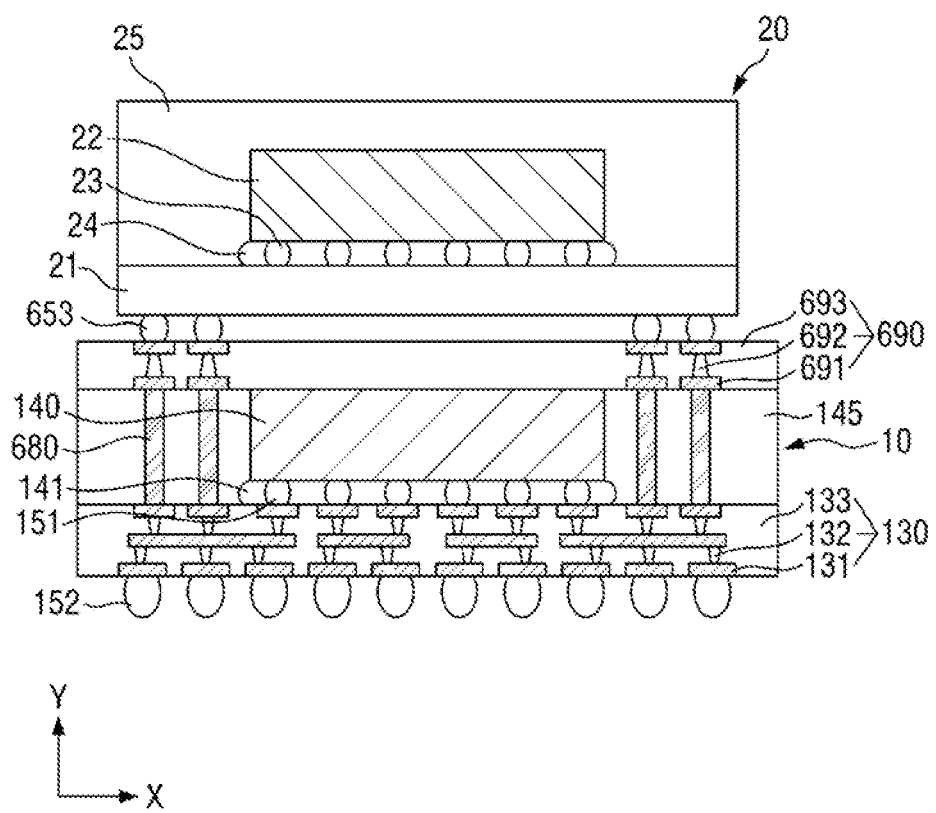
FIG. 20 is a cross-sectional view of a semiconductor package according to an exemplary embodiment of the present inventive concepts.

FIG. 20 is a cross-sectional view provided to explain a semiconductor package fabricated by a method for fabricating a semiconductor package according to some other exemplary embodiments.

Referring to FIG. 20, in the method for fabricating the semiconductor package according to some other exemplary embodiments of the present inventive concepts, the second package 20 may be formed on a second redistribution layer 690 after the processes illustrated in FIGS. 2 to 5, FIG. 15, and FIGS. 6 to 8, and FIG. 1 are performed.

The second redistribution layer 690 may include a plurality of second wires 691, a second redistribution via 692 connecting each of the plurality of second wires 691, and a second insulation layer 693 surrounding the plurality of second wires 691 and the second redistribution via 692. While the second wires 691 shown in the exemplary embodiment of FIG. 20 include horizontally arranged second wires 691 that are formed on two levels (e.g., in the Y direction), exemplary embodiments of the present inventive concepts are not limited thereto. For example, in other exemplary embodiments, the second wires 691 may be formed on three or more levels.

The second package 20 may include the substrate 21, the second semiconductor chip 22, the fourth solder ball 23, the second underfill material 24, and the second molding layer 25.

In an exemplary embodiment, the second semiconductor chip 22 may be a memory chip. The fourth solder ball 23 may be formed between the substrate 21 and the second semiconductor chip 22 (e.g., in the Y direction). As shown in the exemplary embodiment of FIG. 20, a bottom surface of the fourth solder ball 23 may contact a top surface of the substrate 21 and a top surface of the fourth solder ball 23 may contact a bottom surface of the second semiconductor chip 22. In an exemplary embodiment, the bottom surface of the fourth solder ball 23 may contact a conductive terminal exposed on the top surface of the substrate 21 and a top surface of the fourth solder ball 23 may contact a conductive terminal exposed on a lower surface of the second semiconductor chip 22.

The second underfill material 24 may be formed to surround a side surface of the fourth solder ball 23 between the substrate 21 and the second semiconductor chip 22 (e.g., the outermost lateral side surfaces of the fourth solder ball 23 in the X direction). The second molding layer 25 may be formed to surround the upper surface of the substrate 21 facing the second semiconductor chip 22, the side surfaces of the second underfill material 24, and the upper surface, side surfaces and lower surface of the second semiconductor chip 22.

A third solder ball 653 may be formed between the second redistribution layer 690 and the substrate 21 (e.g., in the Y direction). As shown in the exemplary embodiment of FIG. 20, a top surface of the third solder ball 653 may contact a bottom surface of the substrate 21 and a bottom surface of the third solder ball 653 may contact a top surface of the second redistribution layer. For example, in an exemplary embodiment, the bottom surface of the third solder ball 653 may contact a conductive terminal exposed on the second redistribution layer 690 and the top surface of the third solder ball 653 may contact a conductive terminal exposed on a lower surface of the substrate 21.

The second package 20 may be electrically connected with the first package 10 through the third solder ball 653, the second redistribution layer 690, and the via 680.

Exemplary embodiments according to the present inventive concepts were explained hereinabove with reference to the drawings attached, but it should be understood that the present inventive concepts are not limited to the aforementioned exemplary embodiments, but may be fabricated in various different forms, and may be implemented by a person skilled in the art in other specific forms without altering the technical concept or essential characteristics of the present inventive concepts. Accordingly, it will be understood that the exemplary embodiments described above are only illustrative and should not be construed as limiting.

What is claimed is:

1. A method for fabricating a semiconductor package, the method comprising:
   forming a release layer on a first carrier substrate;
   forming an etch stop layer on the release layer;
   forming a first redistribution layer directly on the etch stop layer, the first redistribution layer comprising a plurality of first wires and a first insulation layer surrounding the plurality of first wires;
   forming a first semiconductor chip on the first redistribution layer after forming the first redistribution layer;
   forming a solder ball between the first redistribution layer and the first semiconductor chip;
   forming a second carrier substrate on the first semiconductor chip;
   removing the first carrier substrate, the release layer, and the etch stop layer; and
   removing the second carrier substrate.

2. The method of claim 1, wherein:
   the release layer has a first etch selectivity;
   the etch stop layer has a second etch selectivity that is smaller than the first etch selectivity; and
   the etch stop layer comprises metal.

3. The method of claim 2, wherein the etch stop layer comprises Ti.

4. The method of claim 1, further comprising:
   forming a metal layer on the etch stop layer, the metal layer comprising a material that is different from a material of the etch stop layer.

5. The method of claim 4, wherein the metal layer and the plurality of first wires comprise a same material.

6. The method of claim 1, wherein the release layer and the first insulation layer comprise a same material.

7. The method of claim 1, wherein a thickness of the etch stop layer is in a range of about 100 nm to about 500 nm.

8. The method of claim 1, further comprising:
   forming a second semiconductor chip on the first semiconductor chip,
   wherein the second carrier substrate is formed on the second semiconductor chip.

9. The method of claim 8, further comprising:
   forming a via adjacent to the first semiconductor chip and spaced apart from the first semiconductor chip in a direction of a top surface of the first carrier substrate;
   wherein the second semiconductor chip is connected to the via.

10. The method of claim 1, further comprising:
    forming a second redistribution layer on the first semiconductor chip, the second redistribution layer comprising a plurality of second wires and a second insulation layer surrounding the plurality of second wires.

11. The method of claim 10, further comprising:
    forming a second semiconductor chip on the second redistribution layer,
    wherein the second carrier substrate is formed on the second semiconductor chip.

12. A method for fabricating a semiconductor package, the method comprising:
    forming a release layer on a first carrier substrate;
    forming an etch stop layer comprising metal on the release layer;
    forming a first redistribution layer directly on the etch stop layer, the first redistribution layer comprising a plurality of first wires and a first insulation layer surrounding the plurality of first wires;
    forming a first semiconductor chip on the first redistribution layer after forming the first redistribution layer;
    forming a solder ball between the first redistribution layer and the first semiconductor chip;
    forming a molding layer that covers the first semiconductor chip; and
    removing the first carrier substrate, the release layer, and the etch stop layer,
    wherein the release layer and the first insulation layer comprise a same material.

13. The method of claim 12, wherein the etch stop layer comprises Ti.

14. The method of claim 12, further comprising:
    forming a metal layer on the etch stop layer, the metal layer comprising a material that is different from a material of the etch stop layer.

15. The method of claim 14, wherein the metal layer and the plurality of first wires comprise a same material.

16. The method of claim 14, wherein a thickness of the metal layer is in a range of about 50 nm to about 350 nm.

17. The method of claim 12, further comprising:
    forming a second semiconductor chip on the first semiconductor chip.

18. A method for fabricating a semiconductor package, the method comprising:
- forming a release layer on a first carrier substrate;
- forming an etch stop layer comprising metal on the release layer;
- forming a first redistribution layer directly on the etch stop layer, the first redistribution layer comprising a plurality of first wires and a first insulation layer surrounding the plurality of first wires;
- forming a first semiconductor chip on the first redistribution layer after forming the first redistribution layer;
- forming a solder ball between the first redistribution layer and the first semiconductor chip;
- forming a molding layer that covers the first semiconductor chip;
- forming a second carrier substrate on the molding layer;
- removing the first carrier substrate, the release layer, and the etch stop layer; and
- removing the second carrier substrate,
- wherein the release layer and the first insulation layer comprise a same material.

19. The method of claim 18, wherein the etch stop layer comprises Ti.

20. The method of claim 18, wherein a thickness of the etch stop layer is about 100 nm to about 500 nm.

* * * * *